United States Patent
Yamashita et al.

[11] Patent Number: 5,808,310
[45] Date of Patent: Sep. 15, 1998

[54] ELECTRON BEAM CELL PROJECTION LITHOGRAPHY METHOD FOR CORRECTING COULOMB INTERACTION EFFECTS

[75] Inventors: Hiroshi Yamashita; Takao Tamura; Hiroshi Nozue, all of Tokyo, Japan

[73] Assignee: NEC Corporation, Tokyo, Japan

[21] Appl. No.: 680,643

[22] Filed: Jul. 17, 1996

[30] Foreign Application Priority Data

Jan. 16, 1996 [JP] Japan .................................. 8-004679

[51] Int. Cl.$^6$ .................................................. H01J 37/30
[52] U.S. Cl. ........................................................ 250/492.22
[58] Field of Search ................................ 250/398, 492.2, 250/492.22, 492.3

[56] References Cited

U.S. PATENT DOCUMENTS

| | | | |
|---|---|---|---|
| 4,463,265 | 7/1984 | Owen et al. | 250/492.2 |
| 5,254,438 | 10/1993 | Owen et al. | 430/296 |
| 5,424,173 | 6/1995 | Wakabayashi et al. | 250/492.3 |
| 5,563,419 | 10/1996 | Tamura | 250/492.22 |

FOREIGN PATENT DOCUMENTS 3-174716  7/1991  Japan .

OTHER PUBLICATIONS

By. T. Tamura et al, "Improved Proximity Effect Correction Technique Suitable for Cell Projection Electron Beam Direct Writing System", *Japanese Journal of Applied Physics*, vol. 33 (1994), Part I, No. 12B, Dec. 1994, pp. 6953–6958.

*Primary Examiner*—Bruce Anderson
*Attorney, Agent, or Firm*—Young & Thompson

[57] ABSTRACT

Disclosed herein is a method of electron beam cell projection lithography, employing an electron beam which is shaped by a first aperture having a first opening and a second aperture having a plurality of second openings. The shaped electron beam is irradiated on a sample surface to expose plurality of patterns on the sample surface, wherein an exposure dose is determined according to an exposure intensity distribution function, thereby correcting a proximity effect, while the exposure dose is also controlled to correct for a beam blur induced by a Coulomb interaction effect. The exposure intensity distribution function includes a term for correcting the Coulomb interaction effect.

15 Claims, 3 Drawing Sheets

ELECTRON BEAM CELL PROJECTION LITHOGRAPHY METHOD FOR CORRECTING COULOMB INTERACTION EFFECTS

BACKGROUND OF THE INVENTION

1. Field of the Invention

The present invention relates to a method of electron beam (EB) lithography used in manufacturing processes of large scale integrated circuits, and more specifically to a cell projection type EB lithography method having a fine control over an exposed line width.

2. Related Art

The cell projection method is an electron beam lithography method utilizing electron beams (e-beams) shaped by a first aperture and a second aperture having arbitrarily shaped openings. The method is advantageous over the conventional variable-shaped beam lithography method in shortening the time required to draw periodic patterns such as those used in the memory cell portion of large scale integration (LSI) memories, typically, a DRAM, for instance.

One such example can be found in the Japanese Patent Laid-Open ("Kokai") No. Hei 3-174716. FIG. 2 depicts this the method which will be described herein as a first related art-electron beam lithography method.

An electron beam 2 emitted from an electron-gun 1 is shaped to have a rectangular cross section by a first aperture 3 having a rectangular opening. The rectangularly shaped electron beam is then irradiated on a second aperture 6 for a cell projection shot via a forming lens 4 and a forming deflector 5. The electron beam which has been shaped into an arbitrary shape by the second aperture 6 is further irradiated onto a desired spot on a sample workpiece 10 via a demagnifying lens 7, deflector 8 and an objective lens 9. In this way, such patterns as a part of an LSI pattern are repeatedly drawn according to the opening formed on the second aperture 6. With this cell projection method, especially in case of memory devices having periodic patterns such as DRAMs, it is possible to greatly decrease the number of exposures to be made, thereby shortening the necessary drawing time. Further, by using a second aperture having a masking portion sized less than the resolution limit and capable of altering the e-beam current density, it is also possible to correct for the well known proximity effect caused by an energy accumulation at unirradiated parts of the sample due to forward and back scattered electrons.

However, it is sometimes difficult to provide an extremely small masking portion having a size less than the resolution limit, since it is difficult to fabricate such fine patterns on the aperture, for which silicon wafers are frequently used, and also to attain sufficient mechanical strength. For instance, the electron acceleration voltage of an EB drawing system generally in use now is 50 kV, so that a thickness necessary to completely mask electrons having this energy would be 20 $\mu$m in case of the typical aperture material silicon. Due to the miniaturization of semiconductor devices, increased acceleration voltages are being required in order to obtain higher resolutions. Therefore, the aperture thickness must also be increased, making it more difficult to fabricate apertures with fine patterns.

A second related art cell projection method in which the proximity effect is corrected by changing the e-beam dose, i.e., exposure time according to the size and/or density of a pattern is disclosed in the Japanese Journal of Applied Physics, Vol. 33 (1994), Part I, No. 12B, pp. 6953–6958. The exposure time is changed by altering the attribute information attached to the pattern data. Specifically, an Exposure Intensity Distribution (EID) function which has been conventionally used is utilized. The energy accumulation within the resist formed on the sample is calculated by using this function, and for each shot of e-beam irradiation, the exposure (dose) is corrected to make the energy accumulation distribution within the drawn pattern uniform in a self-consistent manner. In the conventional EID function, accumulated energy at a distance (r) from a beam penetration point is expressed by, $$f(r)=k\{\exp(-r^2/\beta_f^2)+\eta(\beta_f^2/\beta_b^2)\exp(-r^2/\beta_b^2)\}, \quad (1)$$

where $\beta_f$, $\beta_b$ are forward and back scattering coefficients, respectively, k, $\eta$ are constants, and the first and second parts of the equation representing the forward and back scattering terms, respectively. In this method, the e-beam is treated as having the same beam intensity distributions (beam blur) or having no beam blur at all, regardless of the cell projection area value, i.e., beam current. However, in an actual cell projection lithography, various patterns are used in combination so that the beam current is different according to the specific patterns. For example, when exposing patterns such as for memory cells, in order to attain high throughput while suppressing pattern size fluctuations due to the proximity effect at the peripheral portion of the pattern, as shown in FIG. 3, a large sized cell projection shot is used for an inner portion and a smaller sized cell projection shot is used for the peripheral portion. Therefore, the beam current used for the inner portion and that used for the peripheral portion is different. However, the well known Coulomb interaction effect, i.e., the broadening of the e-beam due to Coulomb repelling among the negatively charged electrons is dependent on the beam current. This results in a difference in the beam shape (beam tailing or beam blur) at the inner portion and the peripheral portion. As such, since the conventional method corrected for the proximity effect assuming the beam blur to be the same, even though they are not, the energy accumulation at the peripheral portion became different than that at the inner portion, resulting in a fluctuation of the peripheral portion pattern size as compared with the inner portion pattern size. FIG. 3 shows this phenomena confirmed by an experiment performed by the present inventors.

FIG. 4 shows an experimentally obtained relationship between the beam current and the required optimum exposure dose. The typical chemically amplified negative EB resist, SAL-601 (Shipley) has been used. From this figure, we can see that as the beam blur decreases with the decrease in the beam current, the necessary dose increases so that the optimum exposure dose also increases. The conventional proximity effect correction method using EID functions could not effectively compensate the proximity effect, because it did not take the change in optimum exposure dose due to the Coulomb interaction effect. Thus there was a size difference induced between the inner and outer peripheral portion of a resist pattern, and pattern definition with high accuracy could not be obtained.

SUMMARY OF THE INVENTION

It is therefore, an object of the present invention to provide a method of proximity effect correction for a cell projection type EB lithography that can accurately correct the effect of Coulomb interaction the degree of which is dependent on the beam current value.

In order to attain this objective, the present invention relies on the discovery that, due to the Coulomb interaction effect, the shape of the e-beam, i.e., beam blur, is dependent on the beam current. The present invention, therefore, uses different EID functions according to an area value of the cell projection shot.

The present invention also attains the above objective by providing an EID function having an added correction term to change the exposure dose in accordance with the Coulomb interaction effect. The added correction term could be either a constant or a polynomial function of an electron beam current having a degree higher than or equal to 1.

Further, a plurality of EID functions may be used in combination to correct the proximity effect.

By utilizing EID functions determined according to the cell projection shot area, accuracy of the pattern dimension is greatly improved. Further, by employing an EID function with a new term added to compensate for the Coulomb interaction effect, accuracy of the pattern dimension is improved without having to provide for excess time for correction.

BRIEF DESCRIPTION OF THE DRAWINGS

The above and other objects, advantages and features of the present invention will be more apparent from the following description taken in conjunction with the accompanying drawing in which.

DESCRIPTION OF THE PREFERRED EMBODIMENTS

Figure 1:
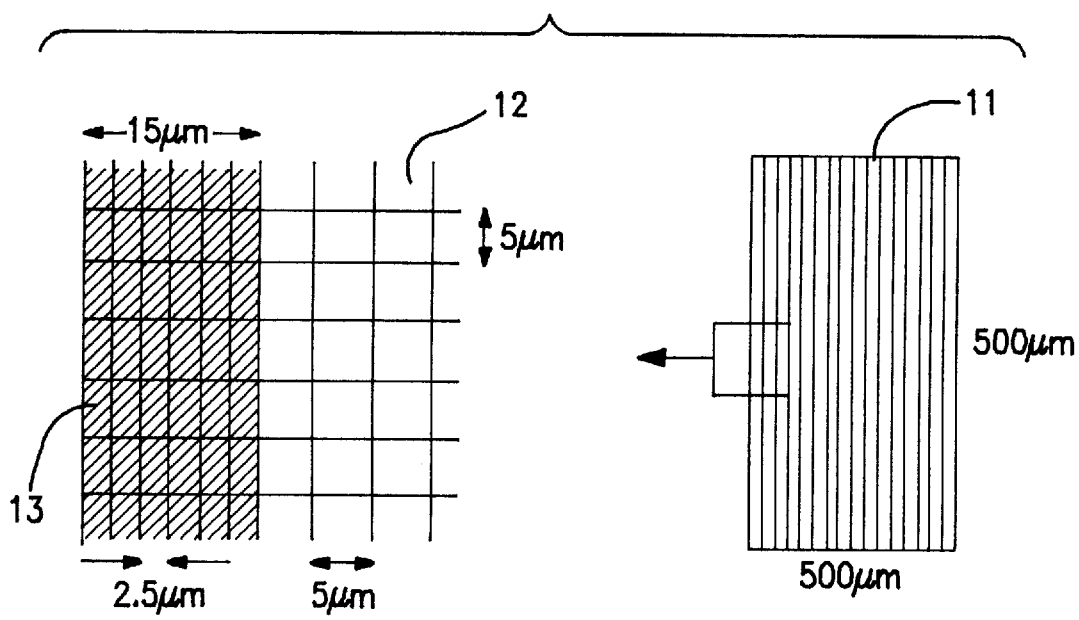
FIG. 1 is a drawing for illustrating the first embodiment of the present invention.

A first embodiment of the present invention will be explained with reference to FIG. 1. FIG. 1 shows a situation of writing a 0.25 $\mu$m line and space pattern 11 on a 0.7 $\mu$m thick chemically amplified EB resist (SAL-601) formed on a Si wafer. The cell projection mask used was made of a 20 $\mu$m thick Si substrate having a maximum cell projection shot size of 125 $\mu$m×125 $\mu$m, which gave a 5 $\mu$m×5 $\mu$m cell projection shot on the sample wafer. A cell projection shot having an area as large as possible but small enough to achieve the necessary resolution was used for the inner, central potion of the pattern. Thus, the size of the inner cell projection shot aperture 12 was 5 $\mu$m×5 $\mu$m. For the outer peripheral portion, a smaller area cell projection shot aperture 13 was used to correct for the proximity effect with finesse. In the present embodiment the size of the cell projection shot aperture 13 was 2.5 $\mu$m×5 $\mu$m. Since the cell area and thus the beam current is different between the central portion and the peripheral portion, the amount of beam blurring (beam broadening) becomes different also. Since the accumulated energy distribution will become different between the central portion and the peripheral portion, parameters of the EID function was altered accordingly. For each of the cell areas, EID function parameters were determined by using a Monte-Carlo simulation. EID functions thus obtained were related one by one to each of the cell projection aperture and used for the actual exposure.

Next, a second embodiment will be explained referring to FIG. 1. In the embodiment depicted in FIG. 1, the amount of beam blur was measured for the two cell projection shot apertures. They were 0.08 $\mu$m and 0.055 $\mu$m for the 5 $\mu$m×5 $\mu$m aperture 12 and the 2.5 $\mu$m×5 $\mu$m aperture 13, respectively. Here, beam blur is defined as the difference between the half width at a 90% maximum point and 10% maximum point. In order to obtain the accumulated dose distribution at the central part of the whole pattern, a conventional EID function was used. EID parameters were estimated using Monte-Carlo simulation assuming the beam blur to be 0.08 $\mu$m. As a result, $\beta_f$, $\beta_b$, and $\eta$ were estimated to be 0.027 $\mu$m, 7.5 $\mu$m, and 0.75, respectively. Next, in the same manner, the accumulated dose distribution at the peripheral portion of the pattern was obtained. However, the EID function used included a new term ($\delta$) to compensate the change in the optimum exposure dose due to the coulomb interaction effect, as shown below.

$$f(r)=k\{\exp(-r^2/\beta_f^2)+\eta(\beta_f^2/\beta_b^2)\exp(-r^2/\beta_b^2)+\delta\} \qquad (2)$$

$\beta_f$, $\beta_b$ and $\eta$ were estimated to be 0.028 $\mu$m, 8.5 $\mu$m, 0.73, and $-3.3\times10^{-4}$ respectively, assuming beam blur to be 0.055 $\mu$m. To save calculation time, fitting was performed with all parameters except $\delta$ fixed.

Finally, exposure dosage for each of the cell projection apertures were determined to self-consistently attain a uniform energy accumulation distribution throughout the whole pattern.

Figure 5:
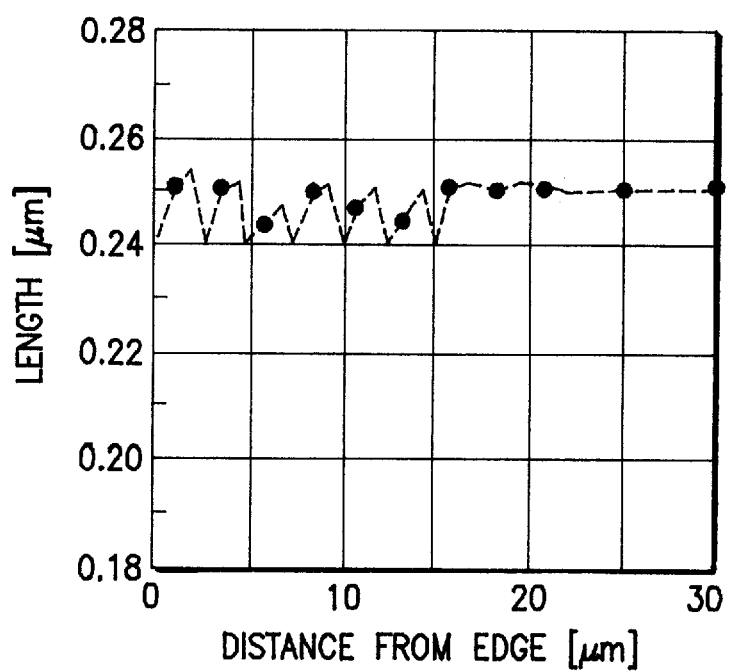
FIG. 5 shows a result of an embodiment of the present invention.
Figure 2:
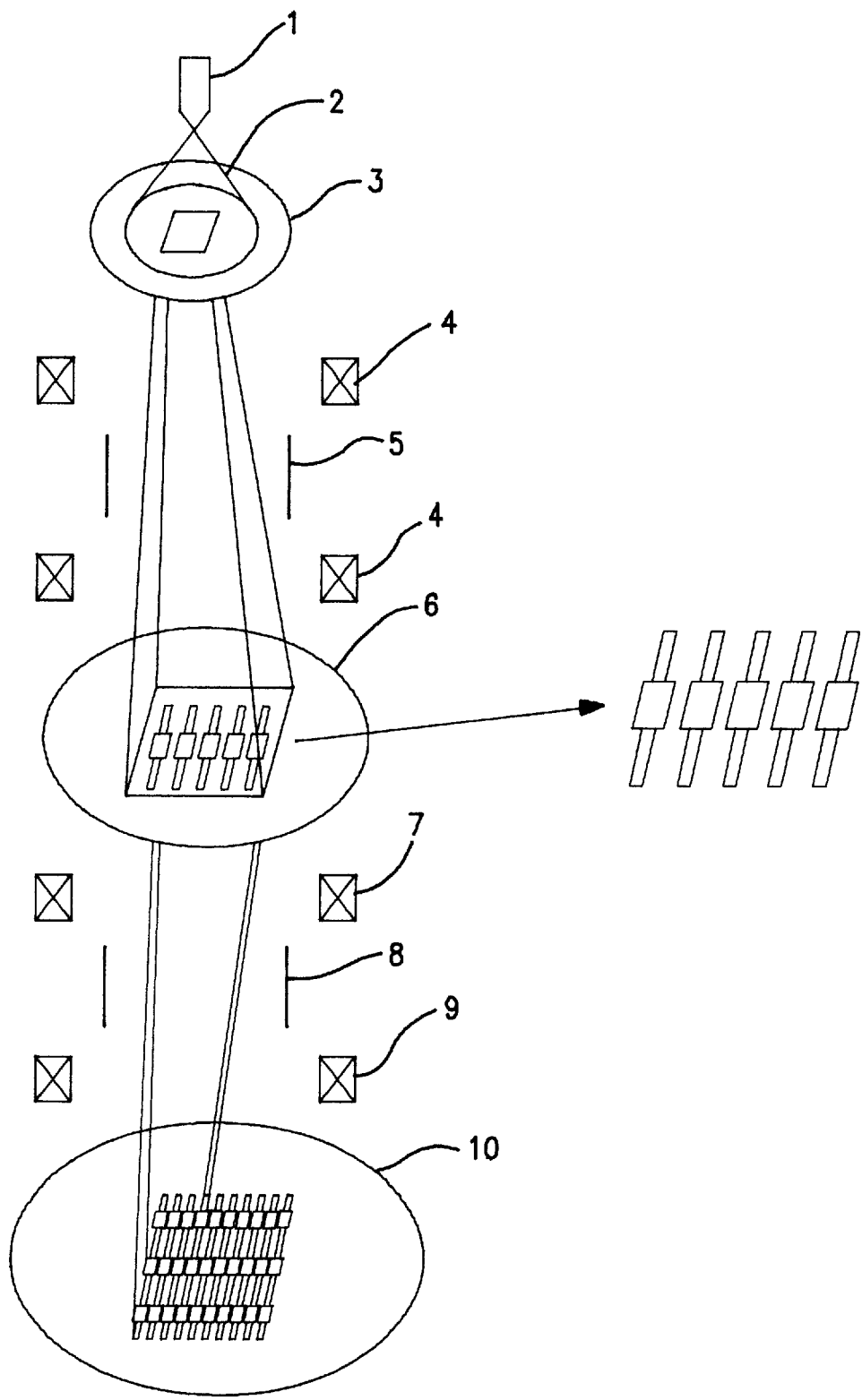
FIG. 2 illustrates the conventional electron beam exposure system of the related art.
Figure 3:
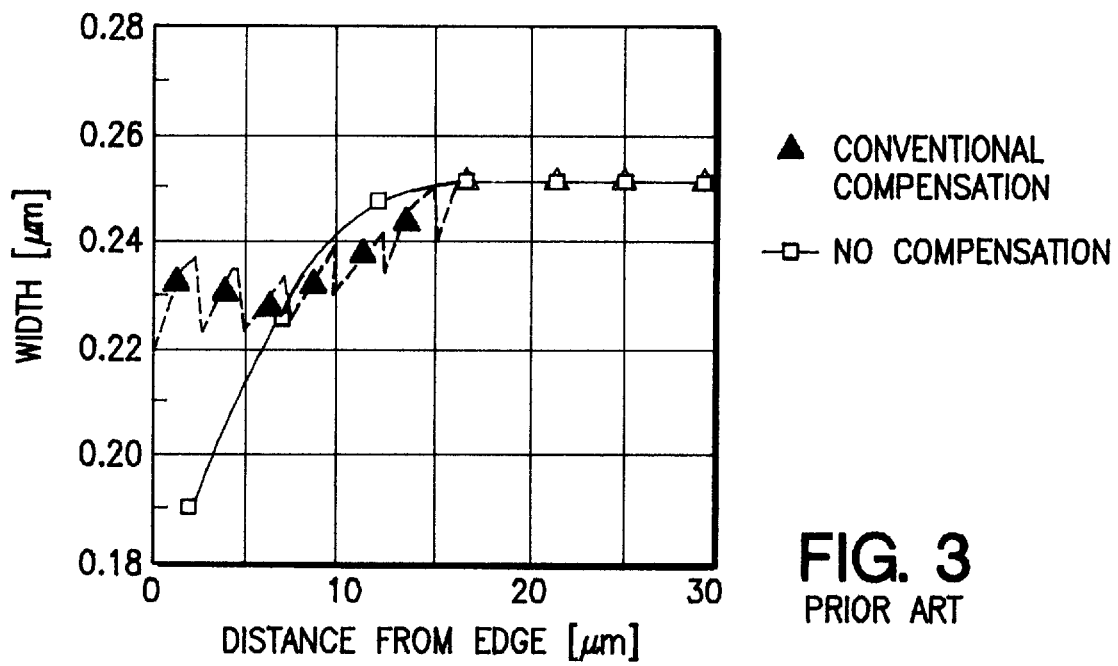
FIG. 3 shows experimentally measured line width vs. distance from the pattern edge using the related art method.
Figure 4:
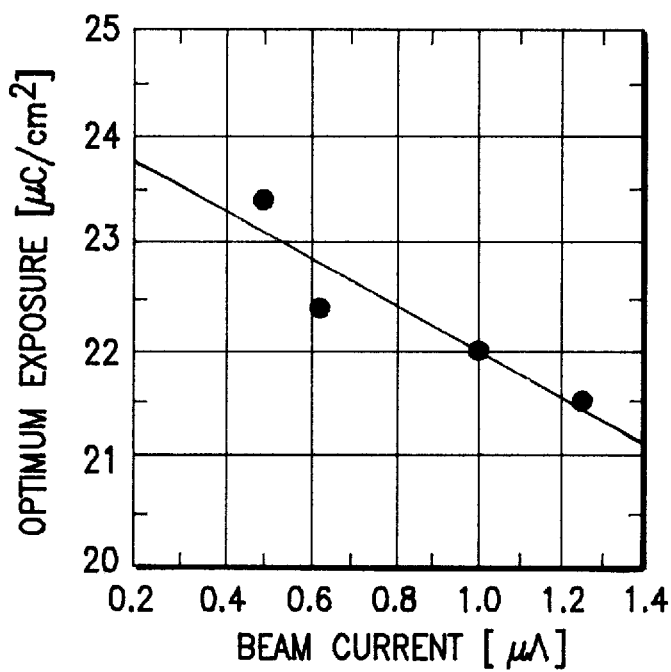
FIG. 4 shows the dependency of the optimum exposure dose on e-beam current.

Proximity effect was corrected by applying the conventional EID function of equation (1) to the central portion of a pattern and the Coulomb interaction corrected EID function of equation (2) to the peripheral portion of the pattern. FIG. 5 shows the relationship of measured line width vs. distance from the pattern edge obtained by employing this embodiment. As shown in the figure, the uniformity of the written line width, i.e., dimension deviation improved from 12% (FIG. 3) to 6%. As seen above, the dimension accuracy, i.e., accuracy of a written line width, is improved by the use of a proximity effect correction that takes into account the compensation of the error induced in the optimum exposure dose due to the Coulomb interaction effect.

In a third embodiment of the present invention, a second aperture equipped with a plurality of cell projection shots having different projection areas is used. In this case, two different Coulomb effect compensation terms $\delta$ are required. However, instead of using a Monte-Carlo simulation, an EID function with a Coulomb effect compensation term $\delta$ was approximated by a linear equation of the beam current was used.

In the foregoing embodiments, the first aperture had a rectangular opening, however, other polygons, circles, ellipses or their deformed forms or a combination of such shapes may be used as necessary.

While the present invention has been described in connection with certain preferred embodiments, it is to be understood that the subject matter encompassed by way of the present invention is not to be limited to those specific embodiments. On the contrary it is intended for the subject matter of the invention to include all alternatives, modifications and equivalents as can be included within the spirit and scope of the following claims.

What is claimed is:

1. A method of electron beam cell projection lithography, employing an electron beam which is shaped by a first aperture having a first opening and a second aperture having a plurality of second openings, said shaped electron beam being irradiated on a sample surface to expose a plurality of patterns on said sample surface, wherein an exposure dose is determined according to an exposure intensity distribution function which corrects for beam blur as a function of beam current, thereby correcting a proximity effect, said exposure dose also being controlled to correct for a beam blur by a Coulomb interaction effect.

2. The method of electron beam cell projection lithography as set forth in claim 1, wherein said exposure intensity distribution function includes a term for correcting said Coulomb interaction effect.

3. The method of electron beam cell projection lithography as set forth in claim 1, wherein said exposure intensity distribution function includes a term for correcting said Coulomb interaction effect, said term being a constant number.

4. The method of electron beam cell projection lithography as set forth in claim 1, wherein said exposure intensity distribution function includes a term for correcting said Coulomb interaction effect, said term being a polynomial function of an electron beam current having a degree higher than or equal to 1.

5. The method of electron beam cell projection lithography as set forth in claim 1, wherein said proximity effect is corrected by a plurality of exposure intensity distribution functions each determined according to an area to be exposed, said functions each including a term for correcting said Coulomb interaction effect.

6. A method of electron beam cell projection lithography, employing an electron beam which is shaped by a first aperture having a first opening and a second aperture having a plurality of second openings, said shaped electron beam being irradiated on a sample surface to expose a plurality of patterns on said sample surface, wherein an exposure dose for each of said plurality of patterns having different shapes is determined according to a plurality of exposure intensity distribution functions corresponding to an amount of a beam blur as a function of beam current, thereby correcting a proximity effect, said exposure dose also controlled to correct for a beam blur induced by a Coulomb interaction effect.

7. The method of electron beam cell projection lithography as set forth in claim 6, wherein said exposure intensity distribution function includes a term for correcting said Coulomb interaction effect.

8. The method of electron beam cell projection lithography as set forth in claim 6, wherein said exposure intensity distribution function includes a term for correcting said Coulomb interaction effect, said term being a constant number.

9. The method of electron beam cell projection lithography as set forth in claim 6, wherein said exposure intensity distribution function includes a term for correcting said Coulomb interaction effect, said term being a polynomial function of an electron beam current having a degree higher than or equal to 1.

10. The method of electron beam cell projection lithography as set forth in claim 6, wherein said proximity effect is corrected by a plurality of exposure intensity distribution functions each determined according to an area to be exposed, said functions each including a term for correcting said Coulomb interaction effect.

11. A method for electron beam lithography which adjusts an exposure of each shot of electron beam irradiation in response to an exposure intensity distribution function, comprising the steps of:

controlling said exposure by a first exposure intensity distribution function when first beam has a first beam blur as a function of a first beam current; and controlling said exposure by a second exposure intensity distribution function when a second beam has a second beam blur different from said first beam blur as a function of a second beam current.

12. A method for electron beam lithography which adjusts an exposure of each shot of electron beam irradiation in response to an exposure intensity distribution function, comprising the steps of:

controlling said exposure by a first exposure intensity distribution function when a first cell projection shot is performed by using a first beam current, whereby a first beam blur is produced by said first cell projection shot; and controlling said exposure by a second exposure intensity distribution function different from said first exposure intensity distribution function when a second cell projection shot is performed by using a second beam current, whereby a second beam blur is produced by said second cell projection shot;

thereby to reduce a difference between said first beam blur and said second beam blur.

13. The method as claimed in claim 12, wherein said first cell projection shot is a first size and said second cell projection shot is a second size different from said first size.

14. The method as claimed in claim 13, wherein said first size is used at an inner portion of a pattern to be irradiated and said second size is used at a peripheral portion of said pattern to be irradiated.

15. A method for electron beam lithography, comprising the steps of:

controlling a first optimum exposure in response to a first exposure intensity distribution when a first portion having a first area of a pattern is irradiated;

controlling a second optimum exposure in response to said first exposure intensity distribution modified to contain an additional term for compensating a Coulomb effect which causes a difference from said first optimum exposure when a second portion having a second area different from said first area of said pattern is irradiated so that a first beam blur produced as a function of a first beam current when said second portion is irradiated is different from a second beam produced as a function of a second beam current when said first portion is irradiated;

thereby to reduce a difference between said first beam blur and said second beam blur.

* * * * *